United States Patent [19]

Galasso et al.

[11] 4,410,504

[45] Oct. 18, 1983

[54] METHOD OF PRODUCING HIGH DENSITY CARBON

[75] Inventors: Francis S. Galasso, Manchester; Richard D. Veltri, East Hartford; Philip J. Birbara, Windsor Locks, all of Conn.

[73] Assignee: United Technologies Corporation, Hartford, Conn.

[21] Appl. No.: 373,767

[22] Filed: Apr. 30, 1982

[51] Int. Cl.³ .................... C01B 31/02; C09C 1/48; C01B 3/24

[52] U.S. Cl. .................... 423/453; 423/458; 423/650

[58] Field of Search ............ 423/448, 449, 453, 454, 423/458, 650

[56] References Cited

U.S. PATENT DOCUMENTS

| | | | |
|---|---|---|---|
| 1,819,732 | 8/1931 | Burwell | 423/650 |
| 2,635,994 | 4/1953 | Tierman | 423/458 |
| 2,885,267 | 5/1959 | Buchmann et al. | 23/212 |
| 2,911,287 | 11/1959 | Stoddard | 423/453 |
| 3,355,248 | 11/1967 | Hayes | 23/209.5 |
| 3,851,048 | 11/1974 | Araki et al. | 423/458 |
| 4,057,396 | 11/1977 | Matovich | 23/252 B |

OTHER PUBLICATIONS

J. C. Bokros, "Properties of Pyrolytic Carbon" in *Chemistry and Physics of Carbon*, ed. by P. L. Walker, Jr., vol. 5, pp. 56–68.

C. David et al., *Carbon*, vol. 1, p. 139, (1964).

*Primary Examiner*—O. R. Vertiz
*Assistant Examiner*—Steven Capella
*Attorney, Agent, or Firm*—Harry J. Gwinnell

[57] ABSTRACT

A method of producing high density carbon at relatively low temperatures is described. By flowing methane gas over glass rods or tubes at flow rates of 10 to 1300 cc per minute and temperatures of 1000° to 1200° C., carbon having a density greater than 2 grams per cubic centimeter and hydrogen gas are produced. An inert gas such as argon can be intermittently pulsed through the system to sweep the system free of low density carbon deposits and heating preferably takes place by means of induction coil heated graphite susceptors or resistance heaters.

6 Claims, 3 Drawing Figures

METHOD OF PRODUCING HIGH DENSITY CARBON

DESCRIPTION

CROSS REFERENCE TO RELATED APPLICATION

Co-pending application Ser. No. 373,768 entitled "Carbon Dioxide Conversion System for Oxygen Recovery", commonly assigned by the same applicants, and filed of even date herewith discloses a method of reclaiming oxygen from carbon dioxide exhaust.

TECHNICAL FIELD the field of art to which this invention pertains is the production of carbonaceous material from a hydrocarbon source.

BACKGROUND ART

Although it is well known to produce hydrogen gas and carbon by decomposing hydrocarbon materials, it is difficult to produce such reaction products and obtain high density carbon. Note U.S. Pat. Nos. 2,885,267; 3,355,248; 3,851,048 and 4,057,396.

High density (greater than 1.8 grams per cubic centimeter) carbon deposits have been able to be produced in the past but generally at temperatures ranging from 2200° C. to 2500° C.

Accordingly, what is needed in this art is a method of producing high density carbon material at relatively low temperatures.

DISCLOSURE OF INVENTION

The present invention is directed to a method for producing hydrogen gas and high density carbon material at relatively low temperatures. According to the present invention carbon having a density greater than about 2 grams per cubic centimeter is produced by passing methane gas over a high temperature stable glass surface heated from about 1000° C. to about 1200° C. Not only is a high density carbon produced, but the system is tolerable to minor impurities such as the presence of moisture.

The foregoing and other features and advantages of the present invention will become more apparent in light of the following description and accompanying drawings.

BEST MODE FOR CARRYING OUT THE INVENTION

The glass surfaces utilized for decomposing and collecting the high density carbon can be any high temperature stable glass which does not soften or deform at the 1000° C. to 1200° C. heating used in the present invention. Exemplary high temperature glasses are quartz and high silica content glass (such as Vycor®) available from Corning Glass Works, Corning, New York. The glass can be used in the form of solid rods, plates, or hollow tubes or cylinders. The carbon deposited on the glass surfaces can be removed simply by tapping the glass on a solid surface and slipping the formed carbon off. In fact, this is one of the advantages of the present invention since the carbon can be easily removed for mass production.

Heating can be provided to the system by any conventional means, although carbon susceptor heating and resistance furnace heating are preferred. Any conventional carbon susceptor setup can be used although a ten kilowatt induction unit used in conjunction with carbon cylinder of known dimensions is preferred. Such an induction unit is available from Lepel Corporation, New York. An exemplary resistance furnace setup includes the use of standard firebrick and Globar silicon carbide rods available from Norton Company, Worcester, Massachusetts. If a conventional resistance heater is used, the coils are wrapped around the glass chamber or other heating chamber containing the glass rods or tubes and sufficient current supplied to the resistance heater to produce the desired temperature. With the graphite susceptor heating, conventional graphite susceptors are placed around the glass tubes or rods according to the present invention and the RF induction coil wrapped around the heating chamber to produce the desired heating. Note FIGS. 1 and 2.

Figure 1:
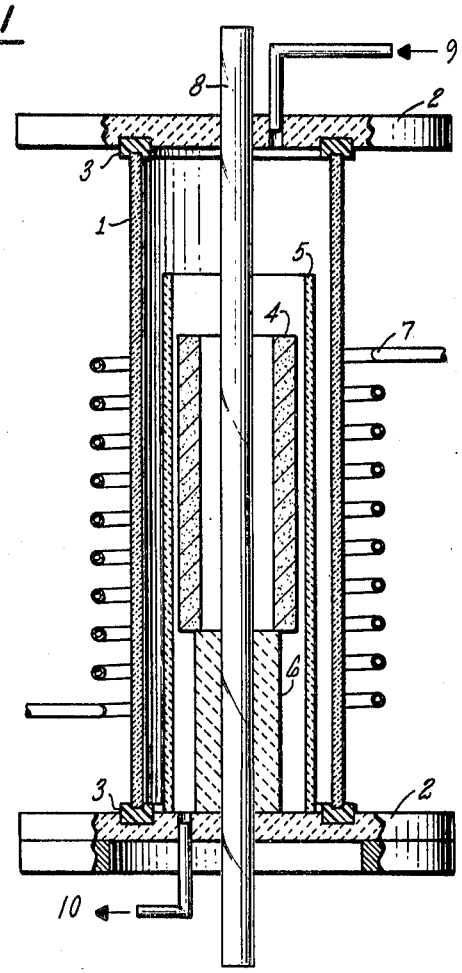
FIGS. 1 and 2 show apparatus useful for forming carbon using susceptor heating according to the present invention.

In FIG. 1 the outer tube 1 which is silica or other nonconductive, high temperature stable ceramic can have any outer diameter but in this case has an outer diameter of 55 millimeters and an inner diameter of 50 millimeters. It is held in place by a pair of water cooled copper support plates 2 and conventional gas seals 3 (such as Neoprene ™ rubber). The conventional, cylindrical graphite susceptor 4 has an outer diameter of 1.5 inches and an inner diameter of 1.25 inches. It is approximately 6 inches in length. It is surrounded by and supported on high temperature stable ceramic radiation shield 5 and pedestal 6, such as zirconia. The induction coil 7 is connected to the Lepel induction unit and comprises approximately ten turns of quarter inch outer diameter copper tubing. The coils of copper tubing have an approximately 3 inch inner diameter. A 25 millimeter outer diameter glass tube 8 is also shown placed in the chamber.

If the carbon is deposited on the outside of the glass tube, the apparatus which can be used is shown in FIG. 1 with methane flow shown by arrow 9 and hydrogen gas exhaust shown by arrow 10. If the carbon is to be deposited on the inside of the glass tube, then the apparatus setup of FIG. 2 can be used with the characters as indicated in FIG. 1, for example methane flow shown by arrow 9 and hydrogen gas exhaust shown by arrow 10. Additionally, argon or other inert gas is flowed through the heated chamber as indicated by arrows 11 and 12 at approximately the same flow rate as the methane to protect the graphite susceptors from oxidation. This result may also be accomplished by evacuating the heated chamber.

Figure 3:
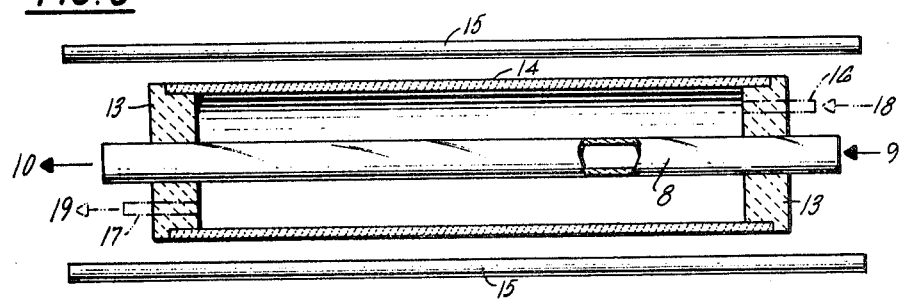
FIG. 3 shows apparatus useful for forming carbon using resistance heating according to the present invention.

A resistance furnace heated arrangement is shown by FIG. 3 where the glass tube 9 is inserted between conventional firebrick seals 13 and surrounded by an alumina muffle 14. Two of the six Globar silicon carbide rods 15 as described above with a 9 inch active heating element are shown placed around the alumina muffle and the entire unit encased in a standard firebrick enclosure. If the carbon deposition is to take place on the inside of the glass tube, the methane will enter as indicated by arrow 9 and the hydrogen gas exhausted as indicated by arrow 10. However, if deposition is desired on the outside of the glass tube, channels 16 and 17 as indicated by the broken lines would be provided through the firebrick seals to allow for entry of the methane gas 18 and exit of the hydrogen gas exhaust 19.

Although temperatures higher than about 1200° C. can be used for the deposition, for both energy efficiency and overall system stability considerations temperatures above 1200° C. are undesirable.

The methane gas can be any conventional methane which can be purchased commercially or produced, having generally accepted standards of commercial purity. In fact, one of the advantages of the present invention is that certain amounts of impurity, such as water, can be tolerated. The methane can be flowed through the reactor at rates anywhere from 10 cc per minute to 1300 cc per minute with about 325 cc per minute being preferred. Methane sources which have been used are commercial grade and research quality methane (for example available from Matheson Gas Products, East Rutherford, N.J. While it is preferred to use laminar flow when supplying the methane to the glass tubes, it is believed that turbulent flow will also work with the present invention.

The amount of methane flowed through the glass or over the glass depends on the surface area of the glass and the temperatures involved. Flow rates of 10 cc per minute to 1300 cc per minute for temperatures ranging from 1000° C.–1200° C. can be used to deposit the high density carbon on the outside of glass rods or tubes or the inside of glass tubes having diameters ranging from 3 millimeters to 30 millimeters. A preferred arrangement is deposition on the inner surface of a 22 millimeter hollow glass tube at a methane flow rate of 50 cc per minute at a temperature of 1200° C.

If desired, an inert gas, such as argon, can also be used to remove any soot (low density carbon) which may be produced due to uneven temperature gradients for example. The argon cleansing of the system is used to clear the soot or other low density carbon deposits from the glass surfaces or high density carbon deposited on such surfaces. Such argon cleansing is performed at about 20 times the pressure of the methane being flowed through and over the glass surface at about the same flow rate. The methane is generally run through the system between atmospheric pressure and 6 psi above atmosphere pressure. Argon pulsing is determined by the flow rate of the methane gas, surface area of the glass, and the temperature of deposition. The higher the flow rate, the more frequent the pulsing. For example using the preferred system described above with a methane flow rate of 10 cc per minute argon flushing was done once an hour over a twenty-four hour deposition period. The frequency of the pulsing can readily be determined by one skilled in this art by observing soot formation during high density carbon deposition.

EXAMPLE I

A carbon foil was produced by inserting a 25 mm inner diameter, 15 centimeter long quartz tube within a graphite susceptor as shown in FIG. 1. The temperature of operation was 1050° C. for six hours with a methane flow of 50 cc per minute. The carbon foil produced could be peeled from the outside walls of the tube while the coating on the inner walls of the tube remained intact.

EXAMPLE II

Figure 2:
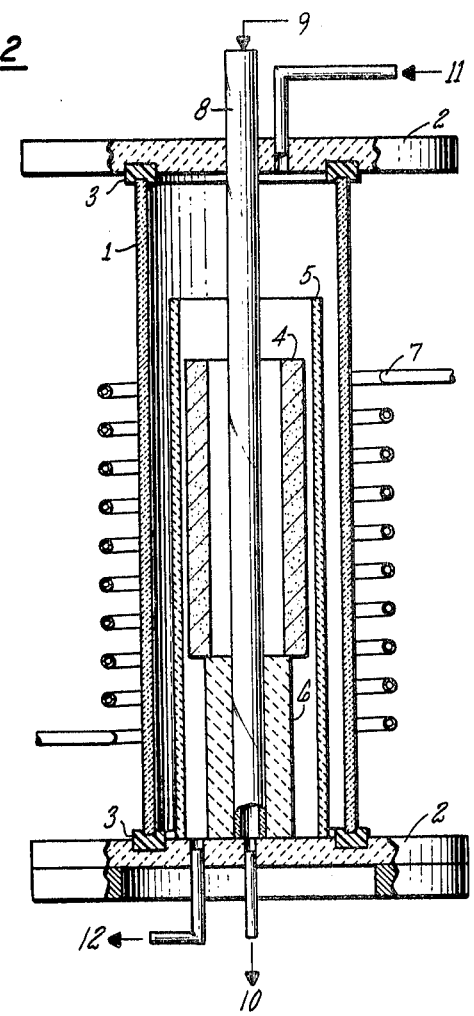

Using apparatus as shown in FIG. 2 a 5 mm inner diameter, 7 mm outer diameter silica tube 1.2 m long was placed in the assembly. The graphite susceptor was a 2.5 cm inner diameter by 3.2 cm outer diameter and 16.5 cm long. Methane flow was 50 cc per minute and the temperature was 1050° C. Carbon film was deposited on the inner walls of the silica tube.

EXAMPLE III

Using the method of Example II the temperature was increased to 1200° C. and the methane flow set at 10 cc per minute. Thick films of carbon were deposited on the inside walls of the 5 mm inner diameter silica tubes. The density of these foils was measured by toluene displacement and ranged from 2.03 grams per cubic centimeter to 2.15 grams per cubic centimeter.

EXAMPLE IV

The process of Example III was run using hourly high pressure argon pulsing. Over a 24 hour carbon deposition period, the methane was flowed at a rate of 10 cc per minute. Argon at 10 cc per minute at a pressure of 20 atmospheres was flowed for one minute every hour. An extremely thick layer of high density carbon was formed.

EXAMPLE V

Using the procedure of Example IV water vapor was added to the methane entering the hot zone by bubbling gas cylinder methane through a flask filled with distilled water. The high densities described above were obtained even in the presence of such water vapor.

EXAMPLE VI

Another deposition furnace was assembled utilizing a resistance heater rather than the induction coil of the above examples. (Note FIG. 2) The furnace employed six 1.25 cm diameter by 46 cm long silicon carbide resistance rod heaters arranged in a circle around a 7 cm diameter by 50 cm long alumina tube. Methane was passed through a silica tube suspended within the aluminum muffle. A platinum/platinum-rhodium thermocouple was used to measure the temperature of the silica tube. Since the internal diameter of the alumina tube was greater than 5 cm, a 25 millimeter inner diameter by 28 millimeter outer diameter silica tube was first placed within this furnace. A 5½ hour run at 1200° C. with a methane flow rate of 100 cc per minute produced dense deposited carbon as in the above examples. A similar run for 2.8 hours with a methane flow rate of 40 cc per minute also resulted in deposited carbon layers resembling that obtained with induction heating. A similar run made at 1200° C. with a methane flow rate of 25 cc per minute with argon pulsing as in Example III above also resulted in high density carbon.

The high density carbon produced according to the present invention can be used in any environment where fluid impermeability at high temperature is desired, for example crucibles or conduits for molten metal. The hydrogen gas produced by this process can be collected by conventional means and used for commercial applications.

While this process can be used purely for hydrogen and carbon production, a particularly attractive use is in combination with a Sabatier reactor to form carbon and hydrogen from carbon dioxide. The Sabatier reactor reacts carbon dioxide from human exhaust, for example, with hydrogen to form methane and water, which can then be processed by this invention to form carbon and hydrogen, thus realizing the cyclic utility of such a system. Note commonly assigned U.S. patent application Ser. No. 373,768 entitled "Carbon Dioxide Conversion System for Oxygen Recovery", commonly assigned and filed by the same inventors as the present invention, of even date herewith, the disclosure of which is incorporated by reference.

Although this invention has been shown and described with respect to detailed embodiments thereof, it will be understood by those skilled in the art that various changes in form and detail thereof may be made without departing from the spirit and scope of the claimed invention.

We claim:

1. A method of producing high density carbon and hydrogen gas comprising flowing methane gas over a high temperature stable glass surface heated to a temperature of about 1000° C. to about 1200° C. to produce hydrogen gas and carbon deposits having a density greater than about 2 grams per cubic centimeter.

2. The method of claim 1 wherein low density carbon deposits are swept from the system with pulsed argon gas.

3. The method of claim 1 wherein the methane flow is about 10 to about 1300 cubic centimeters per minute.

4. The method of claim 1 wherein the glass is in the form of tubes or rods.

5. The method of claim 1 where heating takes place by means of graphite susceptor induction heating or resistance furnace heating.

6. The method of claim 1 wherein the flow is substantially laminar flow.

* * * * *